United States Patent [19]

Varrin, Jr. et al.

[11] Patent Number: 5,015,503
[45] Date of Patent: May 14, 1991

[54] APPARATUS FOR PRODUCING COMPOUND SEMICONDUCTOR THIN FILMS

[75] Inventors: Robert D. Varrin, Jr.; Robert W. Birkmire, both of Newark, Del.

[73] Assignee: The University of Delaware, Newark, Del.

[21] Appl. No.: 476,179

[22] Filed: Feb. 7, 1990

[51] Int. Cl.⁵ .............................................. C23C 16/00
[52] U.S. Cl. ............................ 427/255.2; 427/248.1; 118/715; 118/724; 118/725; 118/719; 156/610; 156/611; 156/612; 156/613; 156/614
[58] Field of Search ............... 156/610, 611, 612, 613, 156/614; 118/715, 724, 725, 719; 427/248.1, 255.2

[56] References Cited

U.S. PATENT DOCUMENTS 4,581,108  4/1986  Kapur .
4,612,411  9/1986  Wieting .

FOREIGN PATENT DOCUMENTS 0211529  2/1987  European Pat. Off. .

Primary Examiner—Richard Bueker
Attorney, Agent, or Firm—Connolly & Hutz

[57] ABSTRACT

An apparatus for producing compound semiconductor thin films on substrates includes a reaction chamber wherein one or more constituents of semiconductor thin film is supplied as a gaseous species in a closed loop system. The apparatus includes hot and cold traps for isolating source materials from the reaction chamber and to provide for controlled delivery of the species. The hot and cold traps communicate with the reaction chamber through hot and cold legs to establish a closed loop recirculating flow. In a preferred embodiment, a thermosiphon provides the flow of gaseous species for formation of copper indium diselenide semiconductor thin films in a closed loop process.

32 Claims, 4 Drawing Sheets

To Reactor

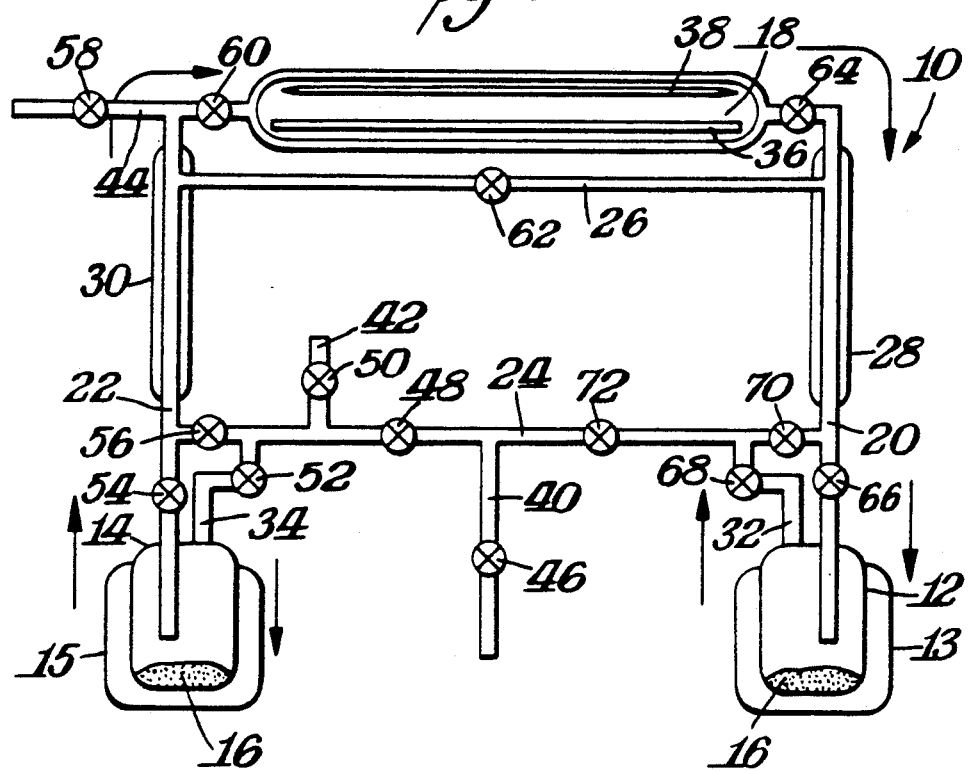
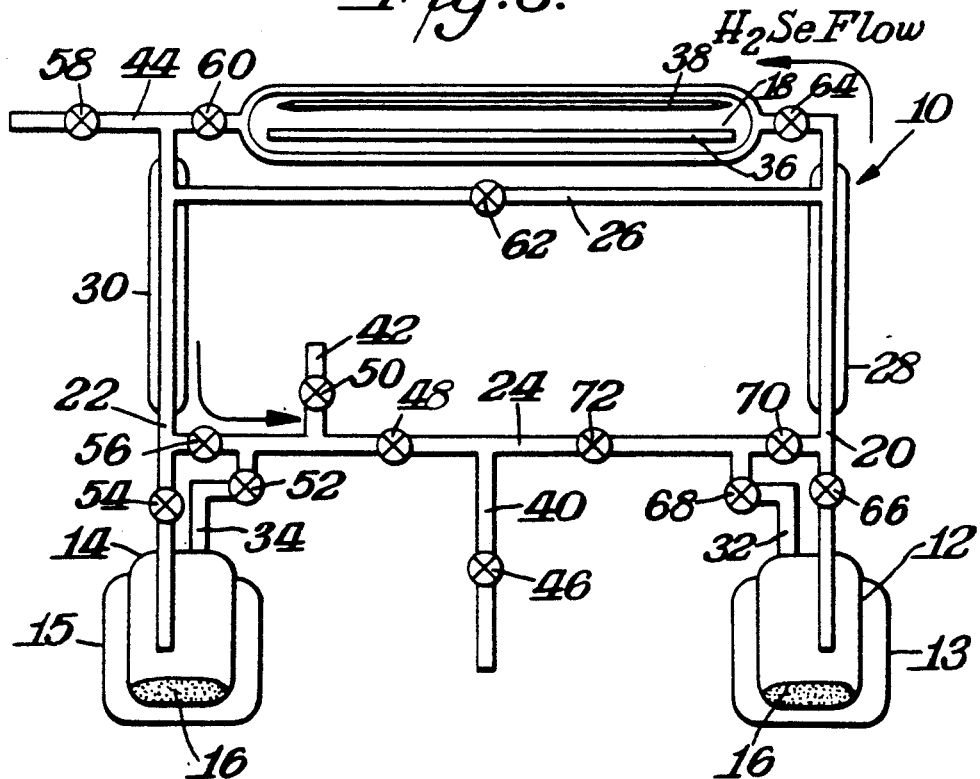

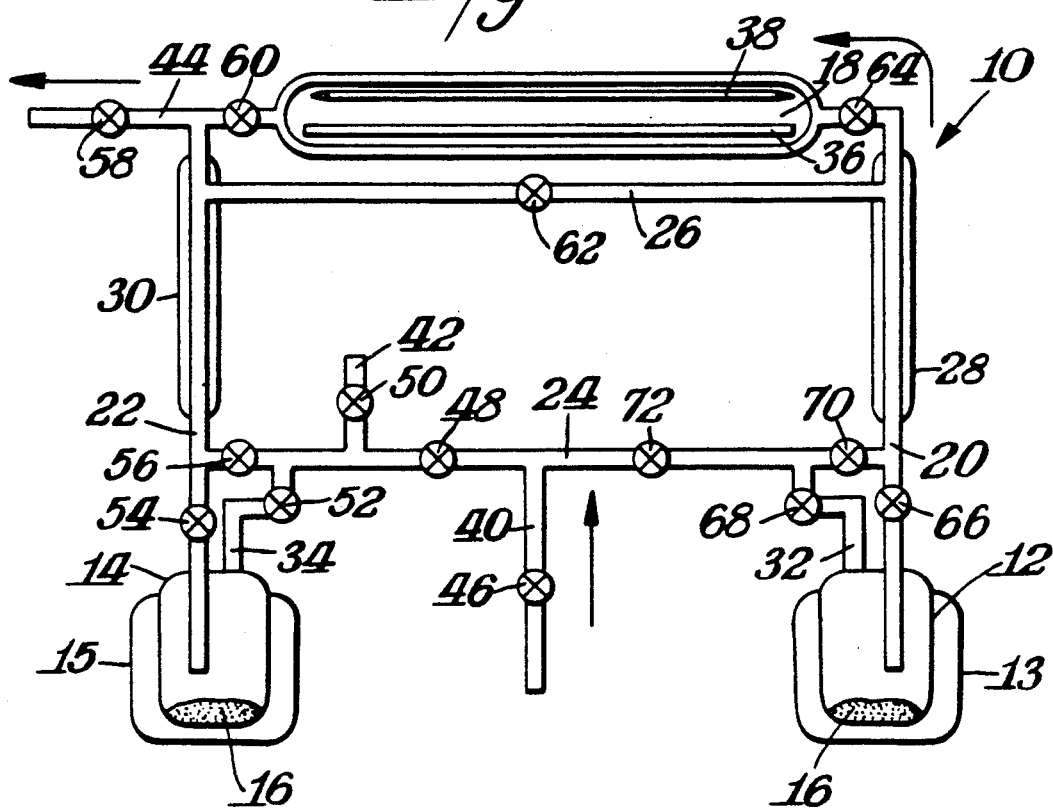
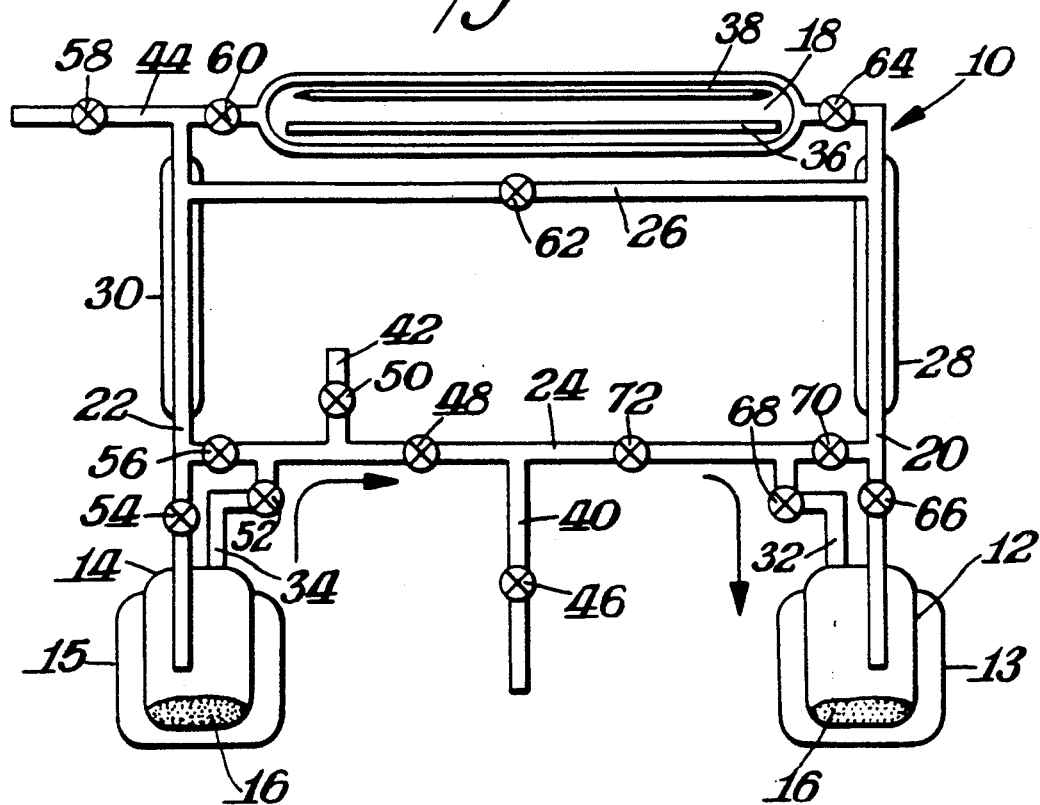

APPARATUS FOR PRODUCING COMPOUND SEMICONDUCTOR THIN FILMS

BACKGROUND OF THE INVENTION

This invention relates to an apparatus and method for fabricating semiconductor thin films. More specifically, the invention relates to the conversion of layers of copper and indium into thin films of the semiconductor copper indium diselenide semiconductor, $CuInSe_2$. $CuInSe_2$ thin films are useful for photovoltaic solar cells device such as described by R. W. Birkmire et al. in *Solar Cells, Volume* 16, aperes 419–427 (1986).

$CuInSe_2$ films have been formed by several different deposition methods including molecular beam epitaxy, physical vapor deposition, sputtering and electrodeposition. An alternate technique for forming $CuInSe_2$ films is described by Kapur et al in U.S. Pat. No. 4,581,108 and by Wieting et al in U.S. Pat. No. 4,612,411. The technique, known in the art as selenization, is carried out in two steps: sequential deposition of copper and indium layers on a suitable substrate; followed by reaction at approximately 400° C. with a gaseous selenium compound or species. The selenium is introduced as either elemental selenium vapor entrained in an inert carrier gas or hydrogen at atmospheric pressure, or as the compound, hydrogen selenide—$H_2Se$. The Wieting et al patent describes use of the selenization process for fabricating $CuInSe_2$ photovoltaic devices. However, selenization using currently known apparatus and methods have a number of disadvantages which limit the applicability of selenization for large scale production of semiconductor thin films and solar cells.

When elemental selenium is used as the source for selenium, the following must be dealt with:

The entire reactor system, including source containers for the elemental selenium, must be maintained at temperatures at least above the melting point of selenium (about 200° C.) and more likely at least 400° C. This makes it difficult to control the rate of delivery of selenium to the reacting substrates, and leads to problems with the selenium depositing on surfaces which are only slightly cooler than the nominal system temperature.

An inert carrier gas must be used to transport the selenium species to the substrate. This is generally accomplished via forced convection in a once through reactor design. Hence, selenium species which do not react with the copper and indium on the substrate after the one and only pass through the reactor are wasted.

When hydrogen selenide is used as the source of selenium, the following must be dealt with:

Hydrogen selenide is an extremely toxic compound. In selenization processes known in the art, only a small portion of the hydrogen selenide which is introduced into a once-through reactor reacts to form $CuInSe_2$. The vast majority of the hydrogen selenide must be treated in a waste treatment system prior to release of the gas stream to the atmosphere.

Therefore, a disadvantage shared by all presently known selenization reactors is poor utilization of either the selenium or hydrogen selenide source material. This is an inherent characteristic of the once-through design of the reactors used for selenization. The disadvantages and problems associated with the current technology of selenization make development of the selenization process into a commercial scale operation less attractive. It should also be noted that many of the disadvantages noted above for the selenization process are common to other semiconductor film formation reactions and associated reactors. For instance, materials utilization is generally considered to be quite low in many chemical vapor deposition (CVD) and plasma enhanced CVD processes used for the formation of such compounds as gallium arsenide, indium phosphide and cadmium telluride.

SUMMARY OF THE INVENTION

An object of this invention is to provide an apparatus for selenization which overcomes the problems and disadvantages associated with existing selenization reaction systems, and furthermore may be employed to form semiconductor thin film materials having a plurality of constituent elements which can be produced in a process whereby at least one constituent element of the semiconductor is deposited on a substrate and the substrate is heated in a reactive atmosphere which contains a gaseous species of at least one further constituent of the semiconductor. The apparatus includes a reaction chamber wherein the substrate having at least one constituent element thereon is heated in the reactive atmosphere containing a gaseous species of at least one further constituent in the form of a pure reaction gas or as a gaseous species entrained in or mixed with an inert gas. The apparatus includes means of supplying the gaseous species from a source material to the reaction chamber. The apparatus also includes hot and cold traps which can isolate volatile solid or liquid source materials from the reaction chamber and allow for controlled delivery of the species as needed for reaction. The hot and cold traps or source bottles include separate heating and cooling capability and are interconnected by a cross-connect line (a piping section, conduit or channel which facilitates passage of gas between the traps in a controlled manner using valves). The hot and cold traps communicate with a heated reaction chamber through hot and cold legs (generally vertically oriented piping, conduit or flow channels through which gaseous species are transported alone or in the presence of an inert gas). The reaction chamber, hot and cold legs, and other connecting piping or conduits are initially heated in such a way as to create a recirculation flow when the hotter, less dense gas rises up through the hot leg and the cooler, more dense gas falls in the cold leg. A bypass line can be provided to allow the thermosiphon flow to be established or maintained in the apparatus without requiring the flows to pass through the reaction chamber. The thermosiphon flow requires no moving parts while it promotes uniform film formation rates and properties through controlled supply of the reactive gas phase species.

THE DRAWINGS

FIG. 1 schematically illustrates the apparatus in accordance with this invention in the start-up mode and also during the thermosiphon initialization. Gas flow directions are indicated by arrows.

FIG. 5 illustrates an apparatus in accordance with this invention in the thermosiphon driven flow mode where the flows are in the reverse direction from those shown in FIG. 4.

FIG. 6 illustrates an apparatus in accordance with this invention in the thermosiphon driven flow mode using the hydrogen selenide as the source material.

FIG. 7 illustrates an apparatus in accordance with this invention in the hydrogen selenide once-through operation mode.

FIG. 8 illustrates an apparatus in accordance with this invention in the source material purification mode.

DETAILED DESCRIPTION

Figure 1:
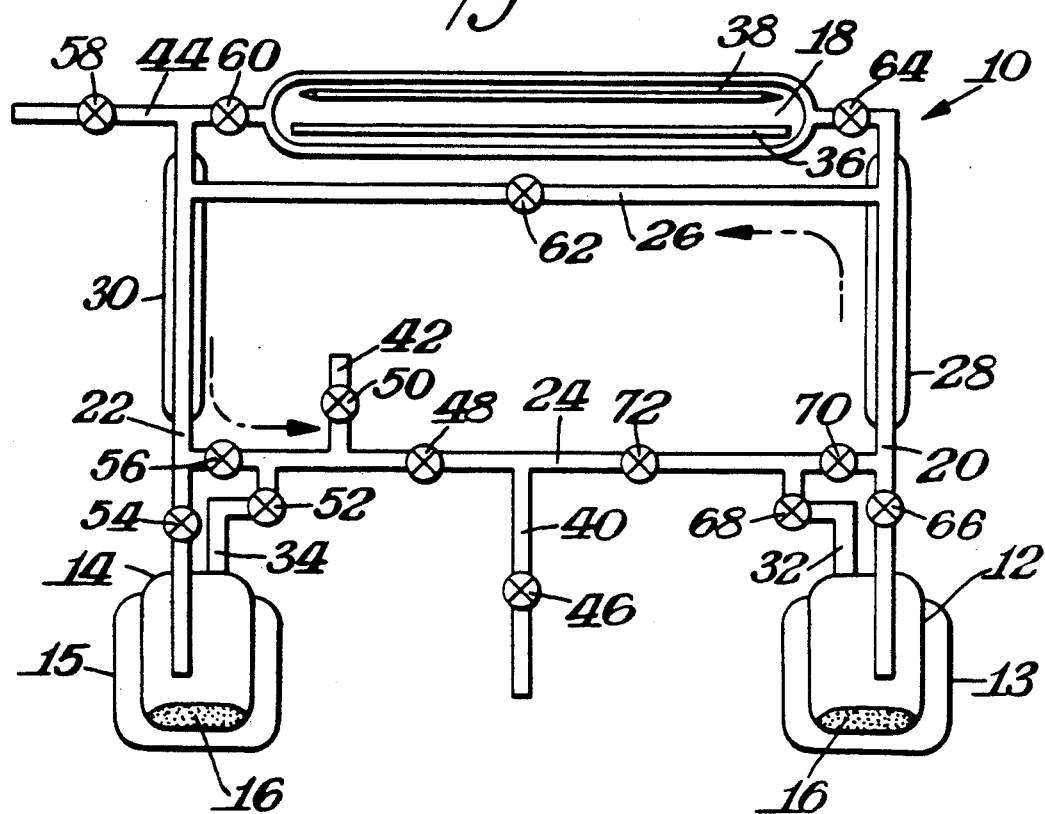

FIG. 1 schematically illustrates an apparatus 10 in accordance with this invention. Apparatus 10 incorporates the following functional and design features:

can be used to establish and maintain a suitable reaction environment in a reaction chamber for the formation of thin film compound semiconductor thin films on substrates;

can be used with either volatile solid or liquid or gaseous sources of one or more constituents of the compound semiconductor thin film;

can be operated in a closed loop recirculating fashion with either gaseous or volatile reactants, thereby enhancing the utilization of the source material, minimizing the demand on or need for waste treatment systems, and practical containment of potential dangerous reactant species;

facilitates loading and unloading of the substrates from a reaction chamber without necessitating cessation of the closed loop flows;

allows for precracking of the gaseous or volatile reactant species, which permits control of both the type and concentration of reactant compounds in the reaction chamber without effecting the temperature, pressure or flows in the reaction chamber itself;

does not require mechanical or forced draft (pressure driven) convective flow of the reactant species through the reaction chamber in order to deliver reactants to the substrates upon which the compound semiconductor thin films are formed;

permits purification of liquid or solid source materials prior to their transport into the reaction chamber;

does not require continuous use of a waste treatment system for potentially poisonous effluent gases;

permits control of the substrate temperature and source material temperature independent of the temperature of the remainder of the apparatus;

permits impurities and by-products which volatilize from the substrate, the growing compound semiconductor thin film, or the apparatus to be isolated so as to maintain acceptable purity of the reactant species;

allows for the use of potentially corrosive gaseous, solid or liquid source materials through use of appropriate materials of construction.

Apparatus 10 may be used for laboratory scale production of copper indium diselenide thin films or scaled up to a production size system without loss of any of the above design or functional capabilities.

The same design apparatus would be used with alternate source materials and substrates to produce other compound semiconductor thin films.

For the selenization process in apparatus 10, the following conditions exist in the systm during reaction:

nominal substrate and reaction chamber temperature: 300°–500° C.

nominal system pressure: 1 atmosphere elemental selenium partial pressure: 0.144 torr (at about 300° C. in the hot trap) to 26 torr (at about 500° C. in the hot trap)

hydrogen selenide gas concentration (when used): 1–100% by weight inert carrier gas nominal cold trap temperature: 175° C.

The basic structure of apparatus 10 includes a hot trap 12 and a cold trap 14 which can contain elemental selenium 16. Reaction chamber 18 is located above traps 12 and 14, which communicate with reaction chamber 18 by means of vertically oriented hot leg riser 20 and cold leg downcomer 22. Riser 20 and downcomer or cold leg 22 are interconnected by a cross-connect header or line 24 and by-pass line 26. In all cases, lines may be substituted by piping sections, flow channels or other conduits which provide adequate cross-sectional area for passage of the gas phase species. The vertical dimensions of the hot leg riser 20 and cold leg downcomer 22 must be such that thermosiphon flows can be established with reasonable temperature differentials between the two legs in order to provide transport of selenium species to the substrate (a temperature differential of 200° C. has been shown to produce a flow in a laboratory scale system). In order to establish and maintain these temperature differentials, a heater cooler jacket 28 surrounds riser 20 and a heater/cooler jacket 30 surrounds cold leg downcomer 22. Auxiliary lines 32, 34 lead from traps 12, 14 respectively, to cross-connect line 24. A substrate 36 (consisting of copper/indium bilayers on molybdenum coated glass substrates in the case of selenization), and substrate heater 38 are located in reaction chamber 18. Substrate heating means external to reaction chamber 18, e.g. infrared lamps and inductive heaters, may be employed in place of or in conjunction with heater 38. Gas inlet line 40 and waste outlet line 42 lead from crossconnect line 24. Waste line 44 leads from downcomer 22. A plurality of valves 46, 48, 50, 54, 56, 58, 60, 62, 64, 66, 68, 70 and 72 are located in various lines, piping or conduits as illustrated. A separate pyrolysis chamber may also be placed between hot leg riser 20 and reaction chamber 8 wherein the source gas or entrained reactive species undergo homogeneous or heterogeneous pyrolysis, dissociation or thermolysis to render the gas stream inlet to the reaction chamber 8 richer in reactive species or to alter the form of the reactive species already present in the hot leg riser. An example in the case of selenization would be to use the pyrolysis chamber to increase the amount of elemental selenium compounds in a pure or diluted hydrogen selenide gas flow, or increase the amount of $Se_2$ species relative to higher order selenium species, namely $Se_4$ to $Se_8$, evolved from the elemental selenium source in the hot trap. The pyrolysis chamber would either be operated at a temperature greater than that of the reaction chamber or the hot leg riser. Alternatively, a catalytic material could be placed within the pyrolysis chamber or within the reaction chamber 18 itself, or the hot leg riser could also function as the pyrolysis chamber.

Another option in the design of apparatus 10 is to eliminate a separate hot leg riser and reaction chamber and combine the features of the two, wherein substrates would be placed in a combined, vertically oriented riser, reaction chamber. In this case, it may be beneficial to tilt the riser/reaction chamber slightly away from vertical to promote flow instabilities in the rising gas flows as a means of augmenting the mixing of the gas above the substrate.

Use of apparatus 10 for the formation of compound semiconductor thin films allows for control of the following:

rate of heat-up and cool-down of the components of the apparatus as well as the substrate;

steady state control of temperatures or temperature profiles of the components of the apparatus and the substrate before, during and after reactants are introduced to form the compound semiconductor thin films;

gas flow rates through the reaction chamber, around the closed loop, through the hot and cold traps, and to a waste treatment system.

In order to establish necessary conditions for selenization, a startup procedure for the apparatus 10 needs to be completed. This involves heating the reaction chamber, connecting piping, and the hot and cold traps to appropriate temperatures (for example 350° C). This may or may not be followed by heating the hot trap 12 to a higher temperature (to establish a positive net pressure in the trap). FIG. 1 depicts the conditions in the reactor 10 at the completion of the start-up phase. Initially, no flow has been established through the reaction chamber. Valves 48, 56, 62, 70 and 72 are open and the remaining valves closed.

When apparatus 10 is to be operated in a closed loop fashion with either selenium or hydrogen selenide, an initial thermosiphon flow (as shown by the arrows) would be established upward through the hot leg 20, across the by-pass line 26, down the cold leg 22, and across the cross-connect header 24, as shown in FIG. 1. A thermosiphon is a passive flow device which operates on the principal that the density of the fluid in the hot leg riser 20 is less than the density of the fluid in the cold leg downcomer 22. The lighter (less dense) fluid in the hot leg 20 rises and the heavier (more dense) fluid in the cold leg 22 falls, creating an overall recirculation flow. (For purposes of this application, hot may refer to a temperature of about 500° C., and cold may refer to below about 300° C.) In the start-up mode, a heater/cooler jacket 13 around hot trap 12 is brought to a temperature of about 450° C. The remaining components are at about 350°–400° C. During the thermosiphon initialization which is also illustrated in FIG. 1, jacket 28 and jacket 13 are maintained at about 450° C. –500° C.

Figure 2:
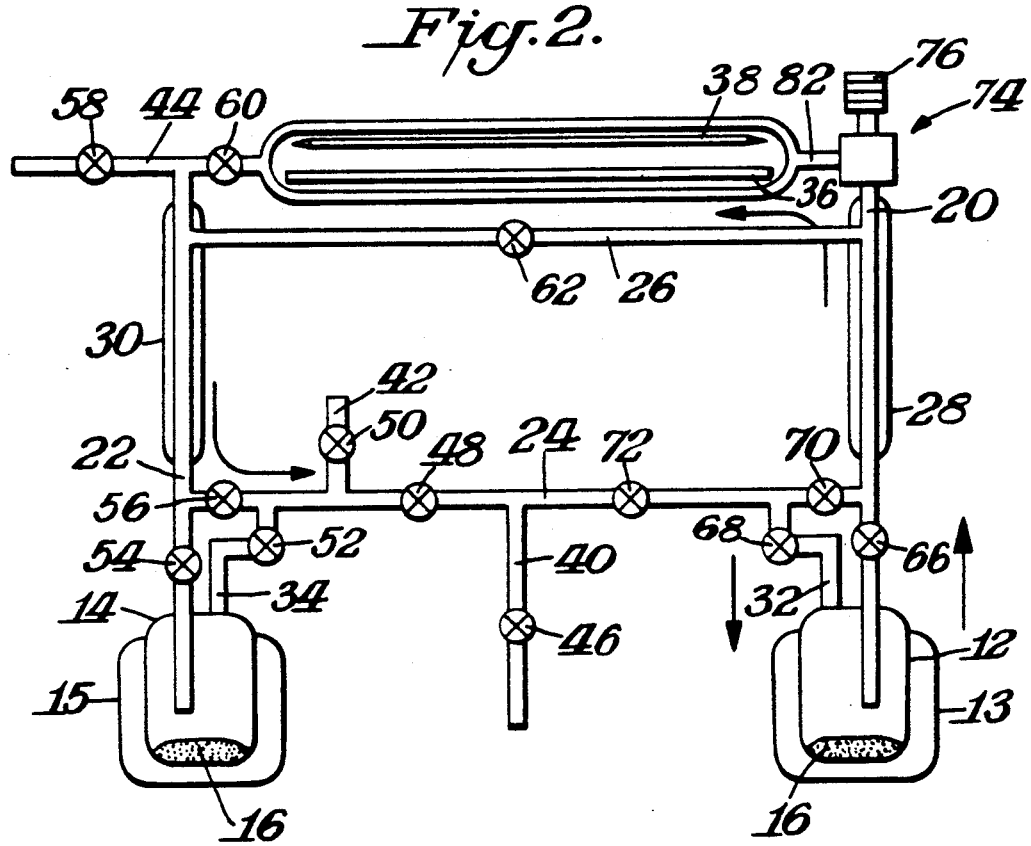
FIG. 2 illustrates an apparatus in accordance with this invention with a thermosiphon driven flow through the reaction chamber and also in the induced draft mode.

An initial thermosiphon flow is established upward through riser 20, through the bypass line 26 and across cross-connect 24. The thermosiphon flow is gradually diverted through the reactor chamber 18 (which is at a temperature at least as hot as the cold leg 22). Then the flow is diverted through the hot trap 12, where selenium is entrained, and delivered up through the hot leg 20 into the reactor chamber 18, as shown in FIG. 2. Valves 48, 56, 60, 66, 68 and 72 are open and the remaining valves are closed. Lines 40, 42 and 44 and jacket 30 are cold, while jacket 13, leg 20 and jacket 28 are at about 450° C.–500° C. during the thermosiphon flow through the reactor. The reaction chamber 18 is maintained at the desired temperature for reaction and the temperature of the substrate is controlled by use of substrate heater 38. A temperature difference of approximately 200° C. between the hot and cold legs should result in an adequate overall flow rate through the closed loop so as to produce 2 microns of $CuInSe_2$ thin films from initial copper/indium bilayer at 400° C. and at 1 atm in a reasonable time.

Figure 4:
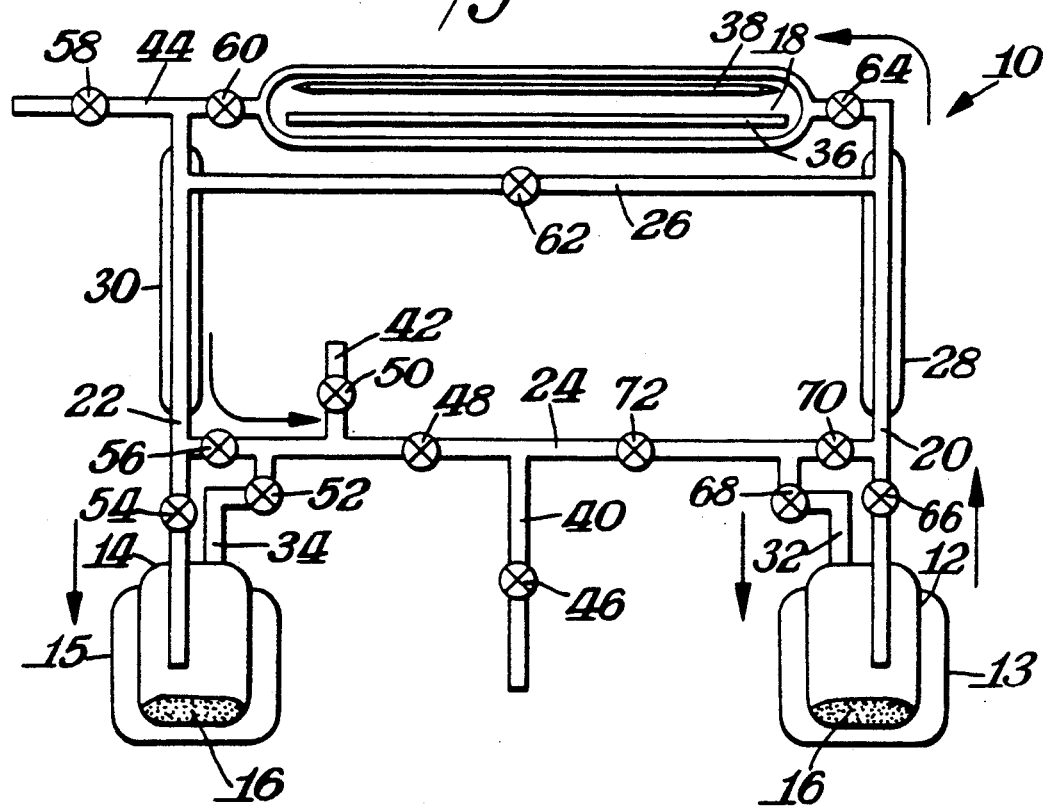
FIG. 4 illustrates an apparatus in accordance with this invention in the thermosiphon driven flow mode with the cold trap in use.

An additional feature of the proposed design is that the flow can also be diverted through the cold trap as opposed to directly across the cross-connect header 24. In this case, the residual selenium (and any impurities which may have been picked up from the Cu/In substrate or walls of the apparatus) can be condensed out and isolated from the purer hot trap material, (as shown by the arrows in FIG. 4). Valves 48, 52, 54, 60, 64, 66, 68 and 72 are open and the remaining valves are closed. Lines 40, 42, 44 and jacket 30 are cold while jacket 13, leg 20, jacket 28 are about 450° C.

Once a significant quantity of selenium is trapped in the cold trap 14, the entire flow path of the reactor can be reversed, where the roles of the hot and cold legs, and hot and cold traps are switched (see FIG. 5). Valves 48, 52, 54, 60, 64, 66, 68 and 72 are open and the remaining valves are closed. Lines 40, 42 and 44 and jacket 28 are cold, while leg 22, and jackets 30 and 15 are about 450° C.

As discussed earlier, a further unique feature incorporated into the closed loop design is that the selenium in the gas flow rising through the hot leg riser 20 can be "cracked" as a result of the higher temperature in order to increase the relative concentration of $Se_2$ species as compared to $Se_6$. As noted, a separate pyrolysis chamber can also be used for this purpose. This may be desirable from a reaction standpoint.

An alternative to the thermosiphon driven, closed loop operation is to direct the flow out of the cold trap 14 directly to a waste treatment facility, and provide makeup inert gas through the gas inlet line 40. The amount of gas supplied could vary from only that required to just compensate for the flow out to the waste treatment system, to greater flows whereby the reactor would operate in a forced draft mode. Higher flow rates could be achieved in this manner, as compared to the thermosiphon flows.

Figure 3:
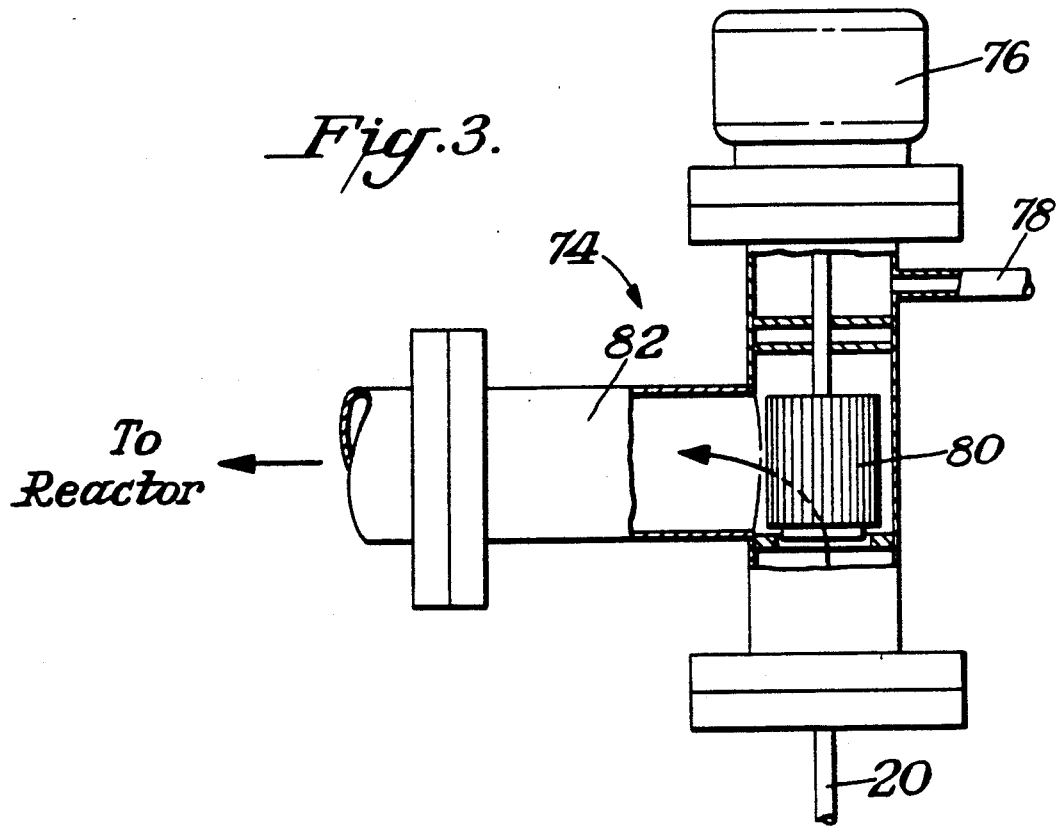
FIG. 3 is an elevation view partly in section of the induction blower contained as part of FIG. 2.

In the event that the flows which could be achieved via a thermosiphon are inadequate for certain processes (such as those which could be achieved at low pressure), reactor 10 can be equipped with an induction blower. The configuration of the system in this case is shown in FIG. 2. Details of an example of a design for the induction blower 74 are shown in FIG. 3. Note that the system can operate in a once through mode or in a recirculation mode with the induction blower 74.

The example induction blower or induction fan 74 includes a magnetically coupled feed through 76 with an inert purge line 78. As indicated by the arrow the fan 80 causes flow from hot leg 20 into reactor chamber 18 through line 82.

In the mode of FIG. 2 which uses the induction blower 74 of FIG. 3, valves 48, 56, 60, 66, 68 and 72 are open and the remaining valves are closed. Lines 40, 42 and 44 and jacket 30 are cold while jacket 13, leg 20, jacket 29 and line 82 are at about 450° C. in the induced draft flow mode.

As discussed above, the conversion or utilization of hydrogen selenide in a conventional once-through reactor is quite low (about 1%). The effluent gas must then be directed to a waste treatment facility, whereby most of the costly hydrogen selenide is rendered unusable for use in the selenization processes.

The apparatus of this invention can be operated with hydrogen selenide in a closed loop mode by "charging" the system with a quantity of gas, followed by recirculation of the gas through the reactor section with a thermosiphon driven flow. FIG. 6 depicts this mode of operation. In this case, there is no continuous demand on the waste treatment system, and the utilization of the gas could be greatly improved. Furthermore, the higher temperature in the hot leg riser 20 will promote more complete thermolysis (dissociation) of the hydrogen selenide, and increase the amount of selenium species available for reaction at the substrate. Also, gas flows across the reacting substrate may produce more uniform gas composition by lessening local gas depletion effects. The flowing system also promotes removal of volatile species and impurities from the reaction chamber. Valves 48, 56, 60, 64, 70 and 72 are open and the remaining valves are closed. In the thermosiphon flow through the reactor using $H_2Se$ of FIG. 6, jackets 13, 15 and 30 and lines 26, 32, 35, 52 and 44 as well as the portions of legs 20 and 22 below cross-connect 24 are cold, while the remaining portions of legs 20 and 22 and cross-connect 24 and reaction chamber 18 are at about 450° C.

When substrates 36 are being loaded or removed, the thermosiphon flow can be diverted across the by-pass line 26, and only the quantity of residual gas in the reactor itself would have to be diverted to the waste system.

The mode of operation as depicted in FIG. 7 is for hydrogen selenide source once-through operation. Valves 46, 58, 60, 64, 70 and 72 are open and the remaining valves are closed.

In the hydrogen selenide once-through operation of FIG. 7, jackets 13, 15 and 30 and lines 26, 32, 34, 42 and leg 22 as well as the portion of cross-connect 24 between line 40 and leg 22 are cold, while the remaining components are at about 450° C.

Apparatus 10 includes the capability to purify the recollected selenium which is contained in the hot and cold traps 12, 14. This would be accomplished by heating one of the traps and diverting the pressure driven flow to the other trap, which is maintained at a lower temperature. This "distillation-like" process becomes particularly attractive when operated at low pressure, as the vapor pressures selenium and selenium species would permit purification at lower temperatures. The purification mode is depicted in FIG. 8. Valves 48, 52, 68 and 72 are open and the remaining valves are closed. Lines 26, 40, 42, 44 and jackets 28, 30 and reactor chamber 18 and the portions of legs 20, 22 above cross-connect 24 are cold, while cross-connect 24, jacket 15 and line 34 are at about 450° C. in the purification mode.

The present invention thus provides reactor to produce copper indium diselenide ($CuInSe_2$) thin films via a selenization process. The $CuInSe_2$ films may be used in compound thin film photovoltaic devices, optoelectronic devices such as thin film transistors, optical detectors and the like.

Although the specific application for the reactor described herein is for the formation of these $CuInSe_2$ films, the reactor is suitable for the deposition of other chalcopyrite semiconductor films (e.g. $CuGaSe_2$, $CuIn_{1-x}Ga_xSe_2$, $CuIn_2$, $CuInSe_{2-x}Se_x$), II-VI compounds (e.g. CdS, CdTe, HgCdTe, ZnCdTe), and III-V compounds (e.g. GaAs, InP).

What is claimed is:

1. An apparatus for producing a compound semiconductor thin film material having a plurality of constituent elements wherein a substrate having thereon at least one constituent element of said semiconductor is heated in a reactive atmosphere which contains a gaseous species of a further constituent of said semiconductor to form the semiconductor thin film, said apparatus compromising:
   a. means for supplying said gaseous species;
   b. a vertically oriented hot leg riser selectively communicating with said supply means;
   c. a reaction chamber located above said supply means and said hot leg riser;
   d. heating means for said reaction chamber;
   e. a vertically oriented cold leg downcomer selectively communicating with said reaction chamber;
   f. a horizontally oriented cross-connect located above said supply means and below said reaction chamber and selectively communicating with said hot leg riser and cold leg downcomer; and
   g. independently controlled heating and cooling means for said supply means, cross-connect and by-pass line, and means for controlling the flow communication through said apparatus;

wherein said supply means, riser, reaction chamber, downcomer and cross-connect function as a recirculating closed loop.

2. The apparatus of claim 1 wherein the closed loop operates as a thermosiphon.

3. The apparatus of claim 1 including a horizontally oriented by-pass line selectively communicating with said hot leg riser and cold leg downcomer above the elevation of said crossconnect.

4. The apparatus of claim 1 wherein the supply means comprises at least one hot trap for collecting, containing, and supplying a source of said further constituent and including means for heating and cooling said hot trap.

5. The apparatus of claim 1 wherein cold traps are included for collecting and containing said further constituent species for reuse and comprising means for heating and cooling said cold traps.

6. The apparatus of claim 1 wherein said hot leg riser comprises a cracking section to decompose a precursor of said additional constituent.

7. The apparatus of claim 1 wherein a pyrolysis chamber between said hot leg riser and said reaction chamber comprises a cracking section to decompose a precursor said further constituent.

8. The apparatus of claim 1 including an induction blower communicating with said reaction chamber and inducing gas flows through the apparatus.

9. The apparatus of claim 1 in which the hot leg riser and reaction chamber are replaced by a vertically oriented combined riser/reaction chamber in which said volatile gas species react with one or more constituents of a semiconductor thin film to form said semiconductor thin film.

10. The apparatus of claim 3 and 4 including a gas inlet line selectively communicating with said cross-connect, a first waste line selectively communicating with said cross-connect, auxiliary lines selectively communicating said cross-connect with said hot trap and said cold trap, and a second waste line selectively communicating with said reaction chamber.

11. The apparatus of claim 1 wherein said constituents are chosen from the group consisting of Groups IB, IIIA and VIA of the Periodic Table.

12. The apparatus of claim 11 wherein said constituents are copper, indium and selenium.

13. The apparatus of claim 4 wherein the reactive atmosphere contains selenium and the source material is elemental selenium.

14. The apparatus of claim 12 wherein said gaseous species is hydrogen selenide gas.

15. A process for producing a compound semiconductor thin film material having a plurality of constituent elements in a closed loop apparatus having as functional components means for supplying source material of at least one constituent element, a vertically oriented hot leg riser selectively communicating with said supply means, a reaction chamber located above said supply means and said hot leg riser, heating means for said reaction chamber, a vertically oriented cold leg downcomer selectively communicating with said reaction chamber, a horizontally oriented cross-connect located above said supply means and below said reaction chamber and selectively communicating with said hot leg riser and cold leg downcomer, and independently controlled heating and cooling means for said supply means, cross-connect and by-pass line, and means for controlling the flow communication through said apparatus, said process comprising the steps of:
   a. preheating the apparatus;
   b. operating the apparatus reactor in a closed loop fashion by establishing an initial thermosiphon flow of the source material through the hot leg riser and across the by-pass line and down the cold leg downcomer and across the cross-connect line;
   c. diverting the flow through the reaction chamber after thermosiphon flow is established through the by-pass line; and
   d. diverting the supply means to entrain the source material through the hot leg riser and into the reaction chamber for reaction with materials on the substrate.

16. The process of claim 15 wherein the semiconductor thin film is copper indium diselenide.

17. The process of claim 15 including controlling the temperature of the substrate in the reaction chamber independently of the temperature of the source material and the temperatures of the components of the remainder of the reactor.

18. The process of claim 16 wherein the source material is hydrogen selenide or elemental selenium.

19. The process of claim 16 wherein the supply means is a hot trap, including the step of diverting the flow through the cold trap instead of the cross-connect line to condense any residual selenium and impurities and isolate them from material in the hot trap.

20. The process of claim 19 wherein the entire flow is reversed after a predetermined quantity of selenium is trapped in the cold trap.

21. The process of claim 15 wherein the constituents of the semiconductor are copper, indium, selenium and sulfur and relative amounts of selenium and sulfur ratios are controlled by controlling flows from selenium and sulfur supply means.

22. The process of claim 15 including cracking the source material in the gas flow through the hot leg riser to increase the relative concentration of reactive species of the constituent element.

23. The process of claim 15 including cracking the source material in a pyrolysis chamber between hot leg riser and the reaction chamber to increase the relative concentration of reactive species of the constituent element.

24. The process of claim 15 including utilization of an induction blower to supplement the thermosiphon flow.

25. The process of claim 15 including closing communication with the supply means and the cold trap, introducing a flow of source gas into the cross-connect line to charge the apparatus, and recirculate the gas through the reaction chamber in a closed loop fashion using a thermosiphon flow or by assistance from an induction blower.

26. The process of claim 24 wherein the source material is hydrogen selenide.

27. The process of claim 15 wherein the supply means is a hot trap, including heating the hot trap or cold trap and maintaining the other trap at a lower temperature to divert pressure driven flow to the other trap and purify the recollected source material in the traps.

28. The process of claim 26 wherein the source material is selenium.

29. The process of claim 15 including diverting the flow from the reaction chamber and across the by-pass line during the loading and unloading of the substrates into and out of the reaction chamber.

30. The process of claim 15 including directly the flow out of the cold trap directly to a waste treatment facility, providing makeup inert gas from a gas inlet line into the cross-connect.

31. A process for producing a compound semiconductor thin film material having a plurality of constituent elements in an apparatus having as functional components means for supplying source material of at least one constituent element, a vertically oriented hot leg riser selectively communicating with said supply means, a reaction chamber located above said supply means and said hot leg riser, heating means for said reaction chamber, a vertically oriented cold leg downcomer selectively communicating with said reaction chamber, a horizontally oriented cross-connect located above said supply means and below said reaction chamber and selectively communicating with said hot leg riser and cold leg downcomer, and independently controlled heating and cooling means for said supply means, cross-connect and by-pass line, and means for controlling the flow communication through said apparatus, said process comprising the steps of:
   a. preheating the apparatus;
   b. selectively flowing gaseous species of the constituent element into the cross-connect line, through the hot leg riser and into the reaction chamber; and
   c. discharging waste from the reaction chamber into a waste line in a once-through operation.

32. The process of claim 30 wherein the constituents of the semiconductor are copper, indium and selenium and the source material is hydrogen selenide.

* * * * *